United States Patent [19]

Ootsuka et al.

[11] Patent Number: 5,309,392
[45] Date of Patent: May 3, 1994

[54] SEMICONDUCTOR IC DEVICE USING FERROELECTRIC MATERIAL IN DATA STORAGE CELLS WITH LIGHT ASSISTED STATE TRANSITION

[75] Inventors: Fumio Ootsuka, Tokorozawa; Masakazu Sagawa, Ome; Jun Sugiura, Musashino, all of Japan

[73] Assignee: Hitachi, Ltd., Tokyo, Japan

[21] Appl. No.: 86,361

[22] Filed: Jul. 6, 1993

Related U.S. Application Data

[63] Continuation of Ser. No. 546,854, Jul. 2, 1990, abandoned.

[30] Foreign Application Priority Data

Jul. 3, 1989 [JP] Japan .................. 1-172683

[51] Int. Cl.⁵ ............................................ G11C 11/22
[52] U.S. Cl. .................... 365/145; 365/109; 365/117; 365/149; 257/295
[58] Field of Search ............... 365/145, 149, 117, 109; 257/295

[56] References Cited

U.S. PATENT DOCUMENTS

| | | | |
|---|---|---|---|
| 3,148,354 | 9/1964 | Schaffert | 365/109 |
| 4,144,591 | 3/1979 | Brody | 365/145 |
| 4,158,201 | 6/1979 | Smith et al. | 365/117 |
| 4,344,155 | 8/1982 | Mollier | 365/200 |
| 4,360,896 | 11/1982 | Brody | 365/145 |
| 4,809,225 | 2/1989 | Dimmler et al. | 365/149 |
| 4,833,647 | 5/1989 | Maeda et al. | 365/149 |
| 4,853,893 | 8/1989 | Eaton et al. | 365/145 |
| 4,860,254 | 8/1989 | Pott et al. | 365/145 |
| 4,873,664 | 10/1989 | Eaton | 365/149 |
| 4,888,630 | 12/1989 | Paterson | 365/117 |
| 4,945,514 | 7/1990 | Land | 365/117 |
| 4,962,322 | 10/1990 | Chapman | 365/184 |
| 4,996,667 | 2/1991 | Murano et al. | 365/117 |
| 5,031,144 | 7/1991 | Persky | 365/145 |
| 5,038,323 | 8/1991 | Schwee | 365/145 |
| 5,051,950 | 9/1991 | Evans et al. | 365/117 |
| 5,060,191 | 10/1991 | Nagasaki et al. | 365/109 |
| 5,063,539 | 11/1991 | Rallapalli | 365/145 |
| 5,099,305 | 3/1992 | Takenaka | 257/295 |
| 5,198,994 | 3/1993 | Natori | 257/295 |

FOREIGN PATENT DOCUMENTS

| | | | |
|---|---|---|---|
| 278167 | 8/1988 | European Pat. Off. | 365/145 |
| 2-49471 | 2/1990 | Japan | 257/295 |
| 2-94559 | 4/1990 | Japan | 257/295 |

OTHER PUBLICATIONS

A. Smith, "Ferroelectric Optical Switch," IBM Tech. Discl. Bull., vol. 9, #2, Jul. 1966, pp. 180-181.

Primary Examiner—Joseph E. Clawson, Jr.
Attorney, Agent, or Firm—Antonelli, Terry, Stout & Kraus

[57] ABSTRACT

In a semiconductor memory array, each cell includes a semiconductor switching element and a capacitor with a ferroelectric material layer. The ferroelectric material layer is sandwiched between opposing electrodes and exhibits a polarization varied in response to a voltage applied across the electrodes in such a manner that the direction of polarization is reversed if the voltage reaches a polarization reversal voltage. First electrodes of the capacitor elements are constituted by portions of semiconductor regions of the associated switching elements, while the second electrodes of the capacitor elements of the cells are constituted by a single common conductor layer. A first conductor is connected in common with the second main semiconductor regions of the switching elements of those cells which are on one column. A second conductor is connected in common with control electrodes of the switching elements of those cells which are on one row. An address signal generator is in electrical connection with the first and second conductors and the single common conductor such that a first voltage not lower than the polarization reversal voltage is applied across the electrodes of a capacitor element of a selected cell selected and a second voltage lower than the polarization reversal voltage is applied across the electrodes of a capacitor element of at least one cell which is a not selected.

8 Claims, 11 Drawing Sheets

SEMICONDUCTOR IC DEVICE USING FERROELECTRIC MATERIAL IN DATA STORAGE CELLS WITH LIGHT ASSISTED STATE TRANSITION

This is a continuation of application Ser. No. 546,854, filed Jul. 2, 1990, now abandoned.

BACKGROUND OF THE INVENTION

The present invention relates to a semiconductor IC device and in particular, to a technique which is useful when it is applied to a semiconductor IC device using ferroelectric material.

DRAMs (Dynamic Random Access Memories) are widely used as semiconductor memory devices, which can be integrated in a high degree. A DRAM includes an array of memory cells, each of which comprises a series circuit consisting of an MISFET for memory cell selection and a capacitor element for information storage. One (1) bit of information is stored in each of these memory cells.

Recently, as the degree of integration has increased, research and development have been carried out, using a ferroelectric material layer for the dielectric layer in the capacitor element for information storage of the memory cell in the DRAM. The ferroelectric material layer is made of, e.g., lead zirconate titanate, by means of which an amount of stored charge about ten times as great as that obtained by means of a conventional dielectric layer made of silicon oxide can be obtained. That is, by using a ferroelectric material layer, since the amount of charge stored by the capacitor element for information storage in the memory cell can be increased, it is possible to reduce the area occupied by a memory cell and thus to increase the degree of integration of the DRAM. Further the α-ray soft error withstand voltage of the DRAM can be improved by using the ferroelectric material layer. Still further, by using the ferroelectric material layer, since it is possible to omit the refresh operation (rewriting operation), it is possible to increase operation speed of the storage device.

In the ferroelectric material layer described above, when a voltage is applied between two electrodes of the capacitor element for information storage, the polarization direction thereof varies, tracing a hysteresis loop. The information writing operation is executed by applying a writing voltage, which is higher than the polarization reversal voltage, between the two electrodes of the capacitor element for information storage in the memory cell in the selected state. The polarization reversal voltage is a voltage at which the polarization direction of the ferroelectric material layer begins to be reversed.

For example, in a DRAM, for which the planar structure is adopted, one of the electrodes of the capacitor element for information storage in the memory cell is composed of a semiconductor region. This semiconductor region is formed in one body with one of the semiconductor regions of the MISFET for the memory cell selection, electrically connected therewith. The other electrode of the capacitor element for information storage is composed of a plate electrode disposed on the semiconductor region described above, opposite thereto. This plate electrode is formed in one body with the plate electrodes of the capacitor elements for information storage in the other memory cells, electrically connected therewith. That is, they are constructed in the form of a common plate over the whole region of the memory cell array.

In this DRAM, for which the planar structure is adopted, in the information writing operation described above, a writing voltage, which is higher than the polarization reversal voltage, e.g., of about 5 V is applied to the common plate electrode. For the memory cell in the selected state, a writing voltage, e.g. of 0 V is applied to the data line and a selecting voltage e.g., of 5 V is applied to the word line. On the other hand, for the memory cell in the unselected state a non-writing voltage of about 5 V or the writing voltage of 0 V is applied to the data line and the unselecting voltage of 5 V or a unselecting voltage of 0 V is applied to the word line.

However, in the DRAM having the common plate electrode as described above, when the voltage on a data line in an unselected memory cell is raised from 0 V to 5 V for a reading operation, with the data line and a word line in the unselected memory cell being supplied with 5 V and the common plate electrode being supplied with 0 V in a previous writing operation, a voltage higher than the polarization several voltage is applied between the electrodes of the information storage capacitor element in the course of a rise of the voltage on the data line from 0 V to 5 V. For this reason, since the information written previously in the memory cell by the information writing operation is reversed in the unselected state (the polarization direction is reversed), the information stored in the memory cell is destroyed.

As a technique for solving such technical problems, a technique is proposed, by which the common plate described above is divided into a plurality of lines, each of which corresponds to one data line (complementary data line), and drive lines are constructed so as to be able to supply the writing voltage and the non-writing voltage independently to the divided lines. These drive lines extend in the direction parallel to the direction in which the data lines extend. Further, each of the drive lines is constructed as a drive line common to the other electrodes of all the capacitor elements for information storage in a plurality of memory cells connected with one data line.

In the DRAM to which this technique is applied, in the information writing operation, the writing voltage (e.g., 0 V) is applied to the data line and the writing voltage (e.g., 5 V) is applied to the other electrode of the capacitor element for information storage through the drive line for the memory cell in the selected state. On the other hand, for the memory cell in the unselected state, the non-writing voltage (e.g., 0 V) is applied to the data line and the non-writing voltage (e.g., 0 V) is applied to the other electrode of the capacitor element for information storage through the drive line. That is, since no voltage higher than the polarization reversal voltage is applied between the two electrodes of the capacitor element for information storage in the memory cell in the unselected state, no destruction of information described above takes place.

The technique described above, by which the drive lines are disposed, is reported e.g. in 1989 IEEE ISSCC, Feb. 17, 1989, pp. 242-243. Further a non-volatile memory, in which a ferroelectric material layer is used in each memory cell, is disclosed in JP-A-62-185376 (published Aug. 13, 1987).

SUMMARY OF THE INVENTION

Since the drive lines of the DRAM described above are disposed for every data line within the memory cell array, in particular the isolation area between every two adjacent drive lines increases. For this reason, a problematical point that the degree of integration of the DRAM is decreased, corresponding to the isolation area between drive lines, has been found by the inventors of the present invention.

An object of the present invention is to provide a technique capable of preventing that information stored in the memory cells in the unselected state is destroyed at the information writing operation or at the information reading operation in a semiconductor IC device including memories, in each of which a capacitor element for information storage is composed of a ferroelectric material layer.

Another object of the present invention is to provide a technique capable of achieving the object described above and at the same time raising the degree of integration by reducing the isolation area between signal lines connected with the memory cells stated above.

Still another object of the present invention is to provide a semiconductor IC device including non-volatile memory circuits having a novel structure for converting optical information into electrical information.

According to an aspect of the present invention, the semiconductor IC device has a memory device, in which a plurality of memory cells are arranged in a matrix form, each of which includes a series circuit including a semiconductor switching element and a capacitor element for information storage, in which a ferroelectric material layer is disposed between electrodes. At the information writing operation or the information reading operation for the memory cell in this memory device, a voltage higher than the polarization reversal voltage for the hysteresis loop in the polarization-applied voltage characteristic curve of the ferroelectric material layer described above is applied between the electrodes of the capacitor element for information storage of the memory cell in the selected state and at the same time a voltage lower than the polarization reversal voltage is applied between the electrodes of the capacitor element for information storage of the memory cell in the unselected state. The voltage lower than the polarization reversal voltage applied between the electrodes of the capacitor element for information storage of the memory cell in the unselected state is e.g., half of the saturation voltage of the hysteresis loop in the polarization-applied voltage characteristic curve of the ferroelectric material layer described above. The ferroelectric material layer is made of e.g.,lead zirconate titanate.

Substantially the same voltage is applied to the other electrodes of the capacitor elements for information storage both in the memory cells in the selected state and in the memory cells in the unselected state of the memory device.

By using the construction described above, since only the voltage lower than the polarization reversal voltage is applied between the electrodes of the capacitor element for information storage in the memory cells in the unselected state, it is possible to prevent the reversal of the polarization direction of the ferroelectric material layer and in this way to prevent the destruction of the information written in the capacitor element for information storage.

Further, one of the electrodes of the capacitor element for information storage of a memory cell in the memory device described above can be formed in one body with the one of the electrodes of the capacitor element for information storage of another memory cell and this one of the electrodes in a memory cell array can be constructed in the form of a common plate electrode As the result, the degree of integration of the memory device can be raised corresponding to the isolation area between two electrodes.

According to another aspect of the present invention, the semiconductor IC device has a non-volatile memory device, in which a plurality of memory cells, each of which includes a series circuit consisting of a semiconductor switching element and a capacitor element for information storage, in which a ferroelectric material layer is disposed, are arranged in the form of a matrix. The polarization directions of the ferroelectric material layers are aligned in one direction by applying the voltage higher than the polarization reversal voltage for the hysteresis loop of the ferroelectric material layer described above between the electrodes of the capacitor elements for information storage in all the memory cells of the non-volatile memory device described above, the polarization direction of the ferroelectric material layers being reversed by irradiating the ferroelectric material layers of the capacitor elements for information storage in predetermined memory cells among all the memory cells with light whereafter the polarization direction of the ferroelectric material layer in the capacitor element for information storage in every memory cell is electrically detected.

According to still another aspect of the present invention, the semiconductor IC device has a non-volatile memory device, in which a plurality of memory cells, in each of which a ferroelectric material layer is disposed between the gate insulating layer and the gate electrode of a field effect transistor, are arranged in the form of a matrix. The polarization directions of the ferroelectric material layers are aligned in one direction by applying the voltage higher than the polarization reversal voltage for the hysteresis loop of the ferroelectric material layer described above between the gate electrodes of all the memory cells and the substrate in this non-volatile memory device, the polarization direction of the ferroelectric material layers being reversed by irradiating the ferroelectric material layers of the capacitor elements for information storage in predetermined memory cells among all the memory cells with light whereafter the polarization direction of the ferroelectric material layer in the capacitor element for information storage in every memory cell is electrically detected.

By the structures described above, since all the above non-volatile memory devices can read out optical information in the form of electric information and further the optical information can be held, even in the state where no external voltage is applied thereto, it is possible to realize a non-volatile memory device for optical information. This non-volatile memory device can be applied to an optical detector for an electronic camera (e.g. imaging element), a two-dimensional optical sensor such as an optical detector for measuring distance, etc., an optical sensor for a pickup device used in a compact disk (CD), a laser disk, etc.

Hereinbelow the structure of the present invention will be explained by using several embodiments In all the figures for explaining the embodiments members having an identical function are represented by a same reference numeral and explanation therefor will not be repeated.

DESCRIPTION OF THE PREFERRED EMBODIMENTS

EMBODIMENT I

In this EMBODIMENT I, the present invention is applied to a memory device, for which the planar structure is adopted.

Figure 3:
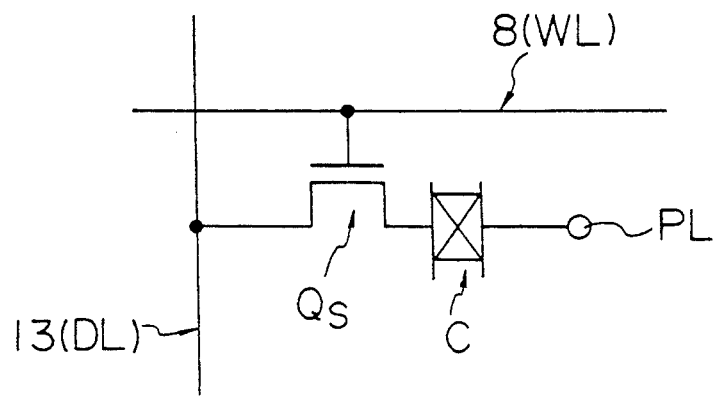
FIG. 3 is an equivalent circuit diagram representing the memory cell indicated in FIG. 1.

The equivalent circuit of the memory cell structure in this EMBODIMENT 1 is indicated in FIG. 3.

As indicated in FIG. 3, a memory cell storing 1 bit information in the memory device is disposed at the intersection of a data line (one of complementary data lines) DL and a word line WL. This memory cell includes a series circuit consisting of a switching element acting for the memory cell selection, i.e. an MISFET $Q_s$ and a capacitor element C for information storage.

One of the semiconductor regions of the MISFET $Q_s$ for memory cell selection for the memory cell described above is connected with one of the data lines DL and the other of the semiconductor regions is connected with one of the electrodes of the capacitor element C for information storage. The gate electrode is connected with one of he word lines WL. The other of the electrodes of the capacitor element C for information storage is connected with the common plate potential line PL.

Between the electrodes of the capacitor element C for information storage in the memory cell there is disposed, as described later, a ferroelectric material layer as the dielectric layer, whose polarization direction varies tracing a hysteresis loop, depending on the voltage applied between the electrodes.

Figure 1:
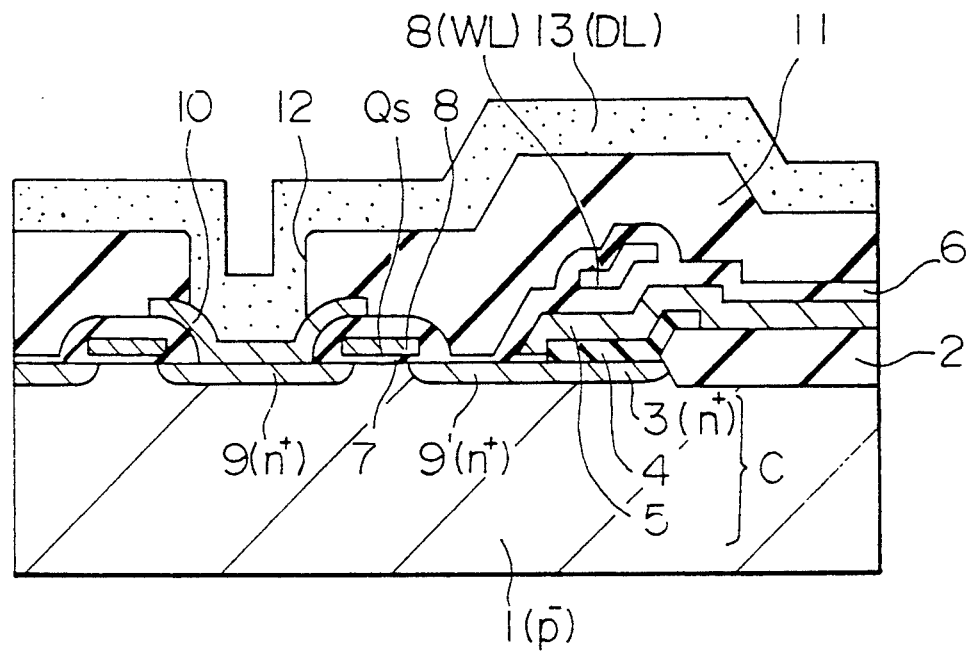
FIG. 1 is a cross sectional view of the principal part of a memory cell in the memory device, for which the planar structure is adopted, which is EMBODIMENT I of the present invention.
Figure 2:
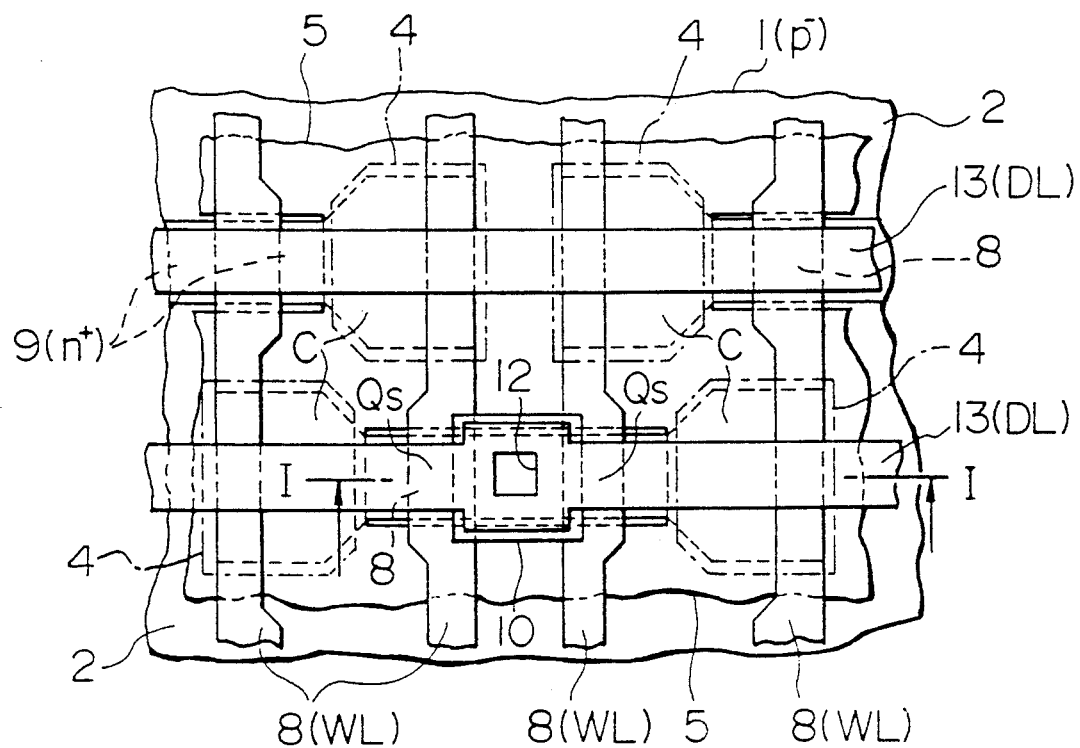
FIG. 2 is a plan view of the principal part of the memory cell indicated in FIG. 1.

The concrete construction of the memory cell will be briefly explained, referring to FIG. 1 (cross sectional view of the principal part) and FIG. 2 (plan view of the principal part). The scale is not identical for FIGS. 1 and 2 and FIG. 1 is a cross sectional view along the line I—I in FIG. 2.

As indicated in FIGS. 1 and 2, the memory cell in the memory device is constructed on a principal surface of a p$^-$ type semiconductor substrate 1. A plurality of memory cells are arranged in a matrix form within a memory cell array. Each of the memory cells thus arranged is formed in a region surrounded by an element isolation insulating layer (field insulating layer) 2 so as to be isolated electrically from the other memory cell.

The MISFET $Q_s$ for memory cell selection for the memory cell are formed in a region surrounded by the element isolation insulating layer 2 on the principal surface of the p$^-$ type semiconductor substrate 1. The MISFET $Q_s$ for memory cell selection is constituted principally by the p$^-$ type semiconductor substrate 1, a gate insulating layer 7, a gate electrode 8, and a pair of n$^+$ type semiconductor regions 9' and 9, which are semiconductor regions, through which current flows, when the MISFET $Q_s$ is conductive, i.e. the source region and the drain region. That is, the MISFET $Q_s$ for memory cell selection is constituted by an n channel type FET. In the present embodiment, although not shown in detail in the figures, the MISFET $Q_s$ is constituted by the LDD (Lightly Doped Drain) structure. The gate electrode 8 stated above is connected electrically with the gate electrodes 8 of the MISFETs $Q_s$ for memory cell selection for the other memory cells arranged in the gate width direction through the word line (WL) 8. The gate electrodes and the word line 8 are formed in one body by a same conductive layer.

The capacitor element C for information storage includes an n$^+$ type semiconductor region 3 serving as the lower electrode, a ferroelectric material layer 4, and a common plate electrode 5 serving as the upper electrode, which are successively superposed on each other. The n$^+$ type semiconductor region 3 serving as the lower electrode is formed in one body with the other n$^+$ type semiconductor region 9' of the MISFET $Q_s$ for memory cell selection and connected electrically therewith. The common plate electrode 5 serving as the upper electrode is formed in one body with the common plate electrode 5 for the other capacitor elements for information storage for the other memory cells and connected electrically therewith. That is, the common plate electrode 5 is formed as a common plate electrode for all the memory cells in the memory cell array.

Figure 4:
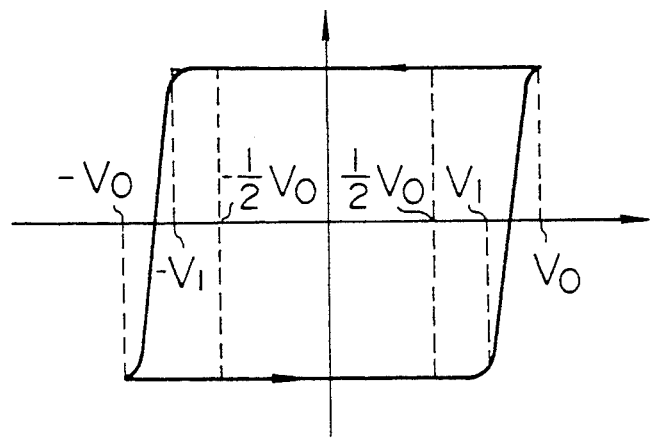
FIG. 4 indicates a polarization-applied voltage hysteresis characteristic curve for a ferroelectric material layer of the capacitor element for information storage in the memory cell indicated in FIG. 1.

The ferroelectric material layer 4 stated above is made of e.g. lead zirconate titanate. This lead zirconate titanate is deposited, e.g., by the sputtering method. The polarization direction of the ferroelectric material layer 4 varies, depending on the voltage applied between the $n^+$ type semiconductor region 3 (lower electrode) and the common plate electrode 5 (upper electrode), tracing a hysteresis loop, as indicated in FIG. 4 (graph indicating hysteresis characteristics of the ferroelectric material layer). The ferroelectric material layer 4 has characteristics that the polarization direction traces a hysteresis loop in a region between a saturation voltage $V_0$ and the other saturation voltage $-V_0$. The saturation voltage $V_0$ is, e.g., 5 V and the other saturation voltage is, e.g., $-5$ V. Each of $V_1$ and $-V_1$ is a polarization reversal voltage, at which the reversal of the polarization direction begins. Thus polarization reversal voltage $V_1$ is, e.g., about 3 V and the other polarization reversal voltage $-V_1$ is, e.g., about $-3$ V.

The data line (DL) 13 is connected with one of the $n^+$ type semiconductor regions 9 of the MISFET $Q_s$ for the memory cell thus constructed through a connection hole 12 formed in an inter-layer insulating layer 11. That is, the data line 13 is connected with the one of the $n^+$ type semiconductor regions 9 through an intermediate conductive layer 10 connected with the one of the $n^+$ type semiconductor regions 9 by self alignment with respect to the gate electrode 8.

Next, various operations of the memory device described above will be briefly explained, referring to FIGS. 1 to 4 and TABLEs 1A to 1C at the end of the present specification. In TABLEs 1A to 1C, PL represents the common plate voltage V applied to the common plate electrode 5; WL1 the voltage applied to the selected word line 8; DL1 the voltage applied to the selected data line 13; WL2 the voltage applied to the unselected word line 8; and DL2 the voltage applied to the unselected data line 13.

Information Writing Operation

As indicated in a in TABLE 1A, the information writing operation is effected by applying the saturation voltage $V_0$, which is a voltage higher than the polarization reversal voltage $V_1$, e.g., 5 V to the common plate electrode 5; the information writing voltage, e.g., 0 V to the data line connected with the memory cell in the selected state; and the selection voltage, e.g., 5 V to the word line 8 connected thereto In this way, a high voltage corresponding to the saturation voltage $V_0$ (in reality, decreased by the threshold voltage of the MISFET $Q_s$ for memory cell selection) is applied between the lower and the upper electrode of the capacitor element C for information storage in the memory cell in the selected state. That is, a voltage higher than the polarization reversal voltage $V_1$ is applied to the ferroelectric material layer 4, which is polarized. The polarization direction of the ferroelectric material layer 4 is indicated by an arrow in a in TABLE 1A.

On the contrary, a non-information writing voltage, which is e.g. a voltage equal to one half of the saturation voltage $V_0$ (or the writing voltage 0 V or a voltage $V_0$) is applied to the data line 13 connected with the memory cell in the unselected state. The voltage equal to one half of the saturation voltage $V_0$ is lower than the polarization reversal voltage $V_1$ (smaller in the absolute value) and it is a voltage, which will not reverse the polarization direction of the ferroelectric material layer 4. The non-selection voltage, e.g., 0 V, (or the selection voltage 5 V) is applied to the word line 8. In this way, since a voltage lower than the polarization voltage $V_1$ is applied always between the lower and the upper electrode of the capacitor element C for information storage in the memory cell in the unselected state, even in the case where information is written previously in the ferroelectric material layer 4, no reversal of the polarization direction takes place and therefore the information is not destroyed.

As indicated in b in TABLE 1A, in the case where the common plate voltage PL applied to the common plate electrode 5 is 0 V, the information writing voltage $V_0$ applied to the data line connected with the memory cell in the selected state should be e.g. 5 V and at this time the polarization direction of the ferroelectric material layer 4 is reversed.

Information Holding Operation

As indicated in a or b in TABLE 1B, the information holding operation is effected by applying the voltage equal to one half of the saturation voltage $V_0$ to the common plate electrode 5, the voltage equal to one half of the saturation voltage $V_0$ to all the data lines connected with the memory cells, and the selection voltage, e.g. 5 V to all the word lines. That is, a voltage lower than the polarization reversal voltage $V_1$ is applied always to the ferroelectric material layer 4 of the capacitor element C for information storage in the memory cell and thus the polarization direction is not reversed.

Information Reading Operation

As indicated in TABLE 1C, the information reading operation is effected by applying an information reading voltage, e.g., 0 V to the data line 13 and the selection voltage to the word line in the memory cell in the selected state, and thereafter raising the common plate voltage PL applied to the common plate electrode 5 from one half of the saturation voltage $V_0$ (the voltage in the holding state) to the saturation voltage $V_0$. As indicated in a in TABLE 1C, in the case where the polarization direction is held by the saturation voltage applied between the lower and the upper electrode of the capacitor element C for information storage in the memory cell in the selected state, since the voltage applied to the data line 13 remains unchanged, it is read out as information "1" or "0". Further, as indicated in b in TABLE 1C, in the case where the polarization direction is changed in the memory cell in the selected state, since the potential of the data line 13 is varied, it is read out as information "0" or "1".

On the contrary, the non-information reading voltage, e.g. the voltage equal to one half of the saturation voltage $V_0$, is applied to the data line 13 connected with the memory cell in the unselected state. This voltage equal to one half of the saturation voltage $V_0$ is a voltage, which will not reverse the polarization direction of the ferroelectric material layer 4. The non-selection voltage, e.g., 0 V, is applied to the word line 8.

Although the memory device, for which the planar structure of the present embodiment is adopted, adopts the open bit line system, it may be constructed also by the folded bit line system.

As described above, the memory device is constructed by arranging a plurality of memory cell, each of which includes a series circuit consisting of the MISFET $Q_s$ for memory cell selection and the capacitor element C for information storage, in which the ferroelectric material layer 4 is disposed between the electrodes ($n^+$ type semiconductor region 3 and common plate electrode 5), and at the information writing operation or the information reading operation in the memory cell of the memory device a voltage higher than the polarization reversal voltage $V_1$ of the hysteresis loop of the ferroelectric material layer 4 is applied between the electrodes of the capacitor element C for information storage in the memory cell in the selected state, at the same time a voltage lower than the polarization reversal voltage $V_1$ stated above being applied between the electrodes of the capacitor element C for information storage in the memory cell in the unselected state. The voltage lower than the polarization reversal voltage $V_1$ described above applied between the electrodes of the capacitor element C for information storage in the memory cell in the unselected state can be, e.g., one half of the saturation voltage $V_0$. By this construction, at each of the information writing operation and the information reading operation, since only the voltage lower than the polarization reversal voltage $V_1$ is applied between the electrodes of the capacitor element C for information storage in the memory cell in the unselected state, it is possible to prevent the reversal of the polarization direction of the ferroelectric material layer 5 and thus the destruction of the information written in the capacitor element C for information storage. As the result, electrical reliability on the operation of the memory device can be improved.

Further a same voltage is applied to the common plate electrode serving as one of the electrodes, i.e. the upper electrode, of the capacitor elements C for information storage in the memory cells in the selected state and those in the unselected state in the memory device described above. By this construction, it is possible to form the upper electrode of the capacitor element C for information storage of a memory cell in one body with the upper electrodes of the capacitor elements C for information storage of the other memory cells in the memory device. As the result, it is not necessary to divide the upper electrode of the capacitor elements C for information storage into a plurality of parts so that each of them corresponds to each data line (DL). Therefore it is possible to raise the degree of integration of the DRAM, corresponding to the isolating area between these divided upper electrodes. Reference numeral 6 represents an insulating layer isolating the word lines from the common plate electrode 5.

EMBODIMENT II

In the present EMBODIMENT II, the present invention is applied to a memory device, for which the STC (Stacked Capacitor) structure is adopted.

Figure 5:
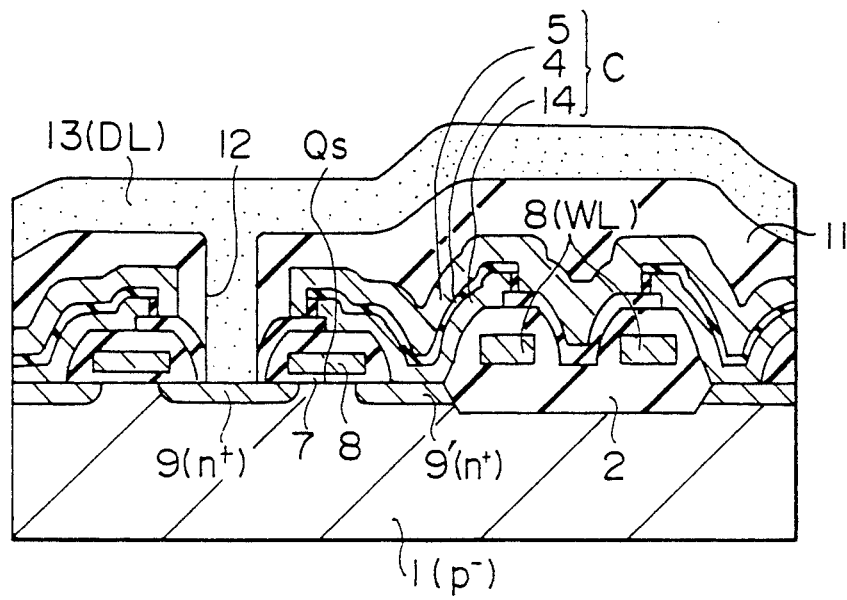
FIG. 5 is a cross sectional view of the principal part of a memory cell in the memory device, for which the stacked capacitor (SIC) structure is adopted, which is EMBODIMENT II of the present invention.
Figure 6:
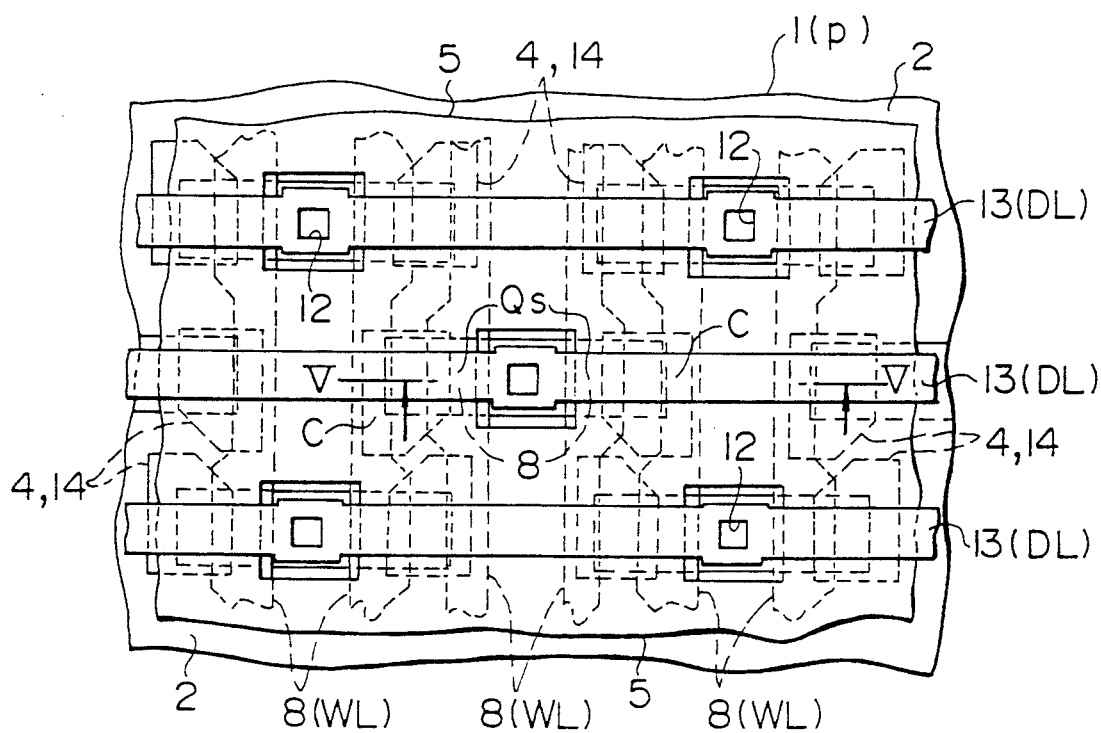
FIG. 6 is a plan view of the principal part of the memory cell indicated in FIG. 5.

The construction of a memory cell in EMBODIMENT II of the present invention is indicated in FIG. 5 (cross sectional view of the principal part) and FIG. 6 (plan view of the principal part). Although the scale is not identical for FIGS. 5 and 6, FIG. 5 is a cross sectional view along the line V—V in FIG. 6.

As indicated in FIGS. 5 and 6, the memory cell in the memory device includes a series circuit consisting of a switching element acting for the memory cell selection, e.g., an MISFET $Q_s$, and a capacitor element C for information storage, for which the STC structure is adopted. The capacitor element C for information storage is constituted by a lower electrode 14 formed on the other $n^+$ type semiconductor region 9' so as to be in ohmic contact therewith; a ferroelectric material layer 4; and a common plate electrode 5 superposed successively on each other. The lower electrode 14 is isolated electrically from those of the other memory cells for every memory cell. This lower electrode 14 is connected with the other $n^+$ type semiconductor region 9' of the MISFET $Q_s$ for memory cell selection at its central portion and the peripheral portion thereof is extended over the gate electrode 8 and the word line 8. Similarly to EMBODIMENT I described previously, the common plate electrode 5 is formed in the form of a common plate electrode within the memory array.

The memory device, for which the STC structure thus constructed is adopted, can take effects substantially identical to those obtained in EMBODIMENT I.

EMBODIMENT III

In the present EMBODIMENT III, the present invention is applied to a memory device, for which a STC structure other than that described in EMBODIMENT II is adopted.

Figure 7:
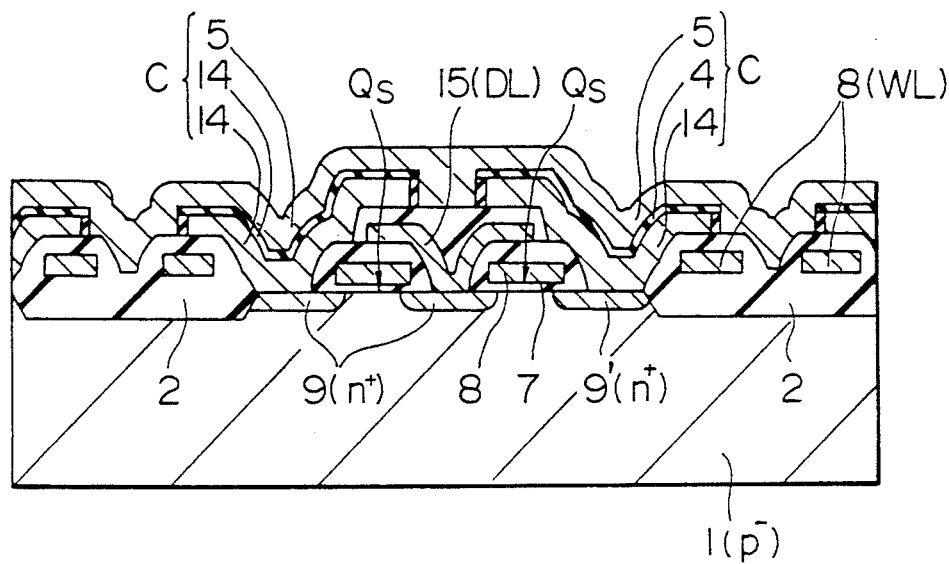
FIG. 7 is a cross sectional view of the principal part of a memory cell in the memory device, for which the STC structure is adopted, which is EMBODIMENT III of the present invention.
Figure 8:
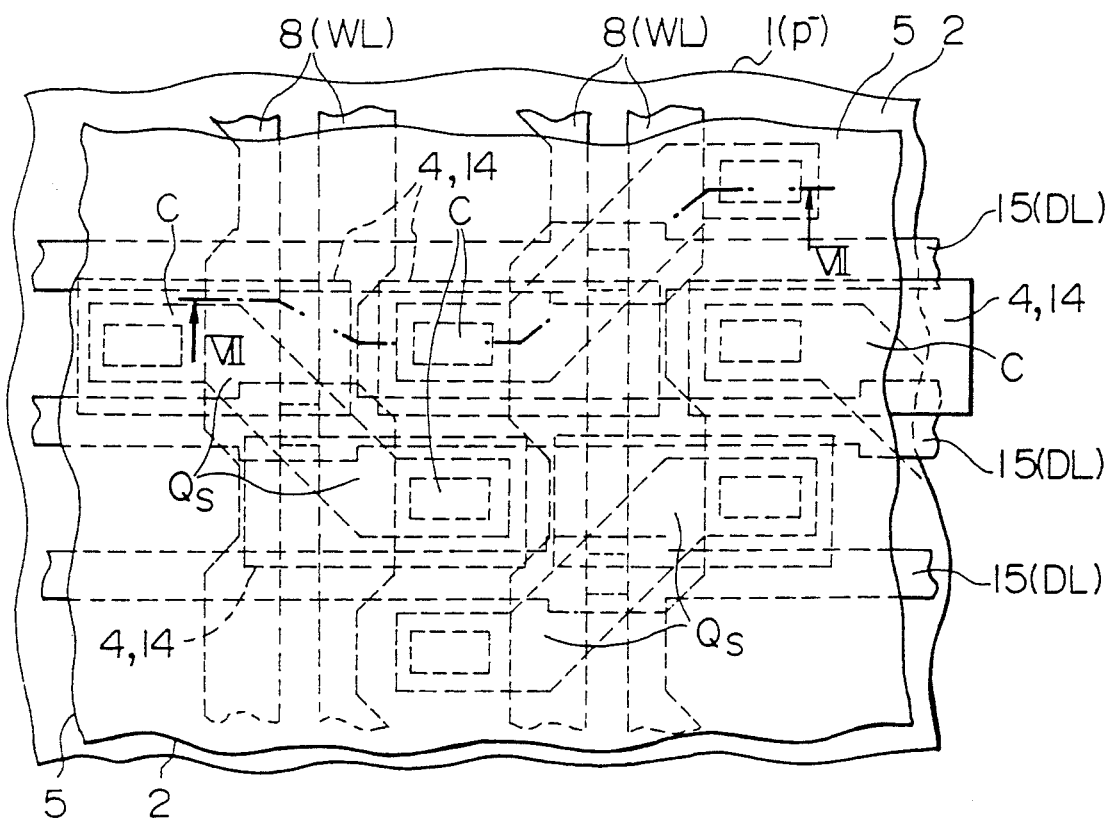
FIG. 8 is a plan view of the principal part of the memory cell indicated in FIG. 7.

The construction of a memory cell in EMBODIMENT III of the present invention is indicated in FIG. 7 (cross sectional view of the principal part) and FIG. 8 (plan view of the principal part). Although the scale is not identical for FIGS. 7 and 8, FIG. 7 is a cross sectional view along the line VII—VII in FIG. 8.

As indicated in FIGS. 7 and 8, although the basic cross sectional structure of the memory cell in the memory device is identical to that of the memory cell in the memory device described previously in EMBODIMENT II, the data lien (DL) 15 is extended between the MISFET $Q_s$ for memory cell selection and the capacitor element C for information storage for which the STC structure is adopted. The data line 15 is made of a material having a good step coverage (e.g. polycrystalline silicon or polycide). This data line 15 is connected with the one of the $n^+$ type semiconductor regions 9 by self alignment with respect to the gate electrode 8 of the MISFET $Q_s$ for memory cell selection. The common plate electrode 5 acting as the upper electrode of the capacitor element C for information storage, for which the STC structure described above is adopted, is formed in the form of a common plate electrode within the memory array, similarly to that described in EMBODIMENTs I and II.

The memory device, for which the STC structure thus constructed is adopted, can take effects substantially identical to those obtained in EMBODIMENT I or II.

EMBODIMENT IV

In the present EMBODIMENT IV, the present invention is applied to a memory device, for which a SPC (Sheath Plate Capacitor Cell) structure is adopted.

Figure 9:
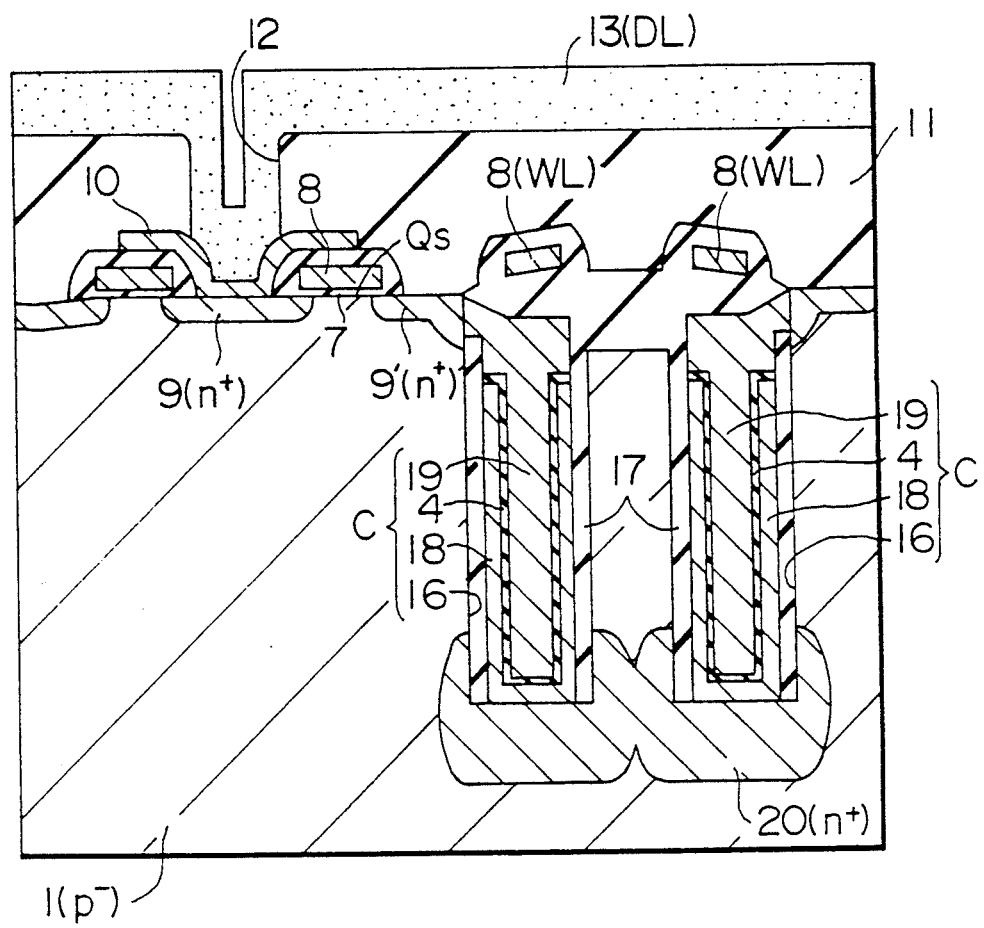
FIG. 9 is a cross sectional view of the principal part of a memory cell in the memory device, for which the sheath plate capacitor cell (SPC) structure is adopted, which is EMBODIMENT IV of the present invention.
Figure 10:
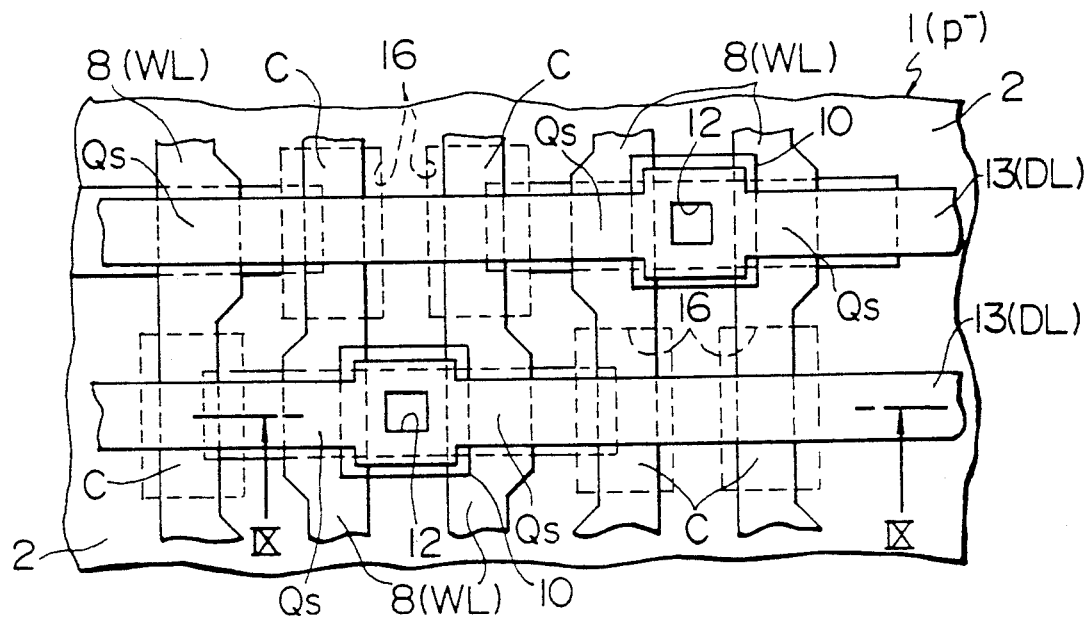
FIG. 10 is a plan view of the principal part of the memory cell indicated in FIG. 9.

The construction of a memory cell in EMBODIMENT IV of the present invention is indicated in FIG. 9 (cross sectional view of the principal part) and FIG. 10 (plan view of the principal part). Although the scale is not identical for FIGS. 9 and 10, FIG. 9 is a cross sectional view along the line IX—IX in FIG. 10.

As indicated in FIGS. 9 and 10, the memory cell in the memory device includes a series circuit consisting of an MISFET $Q_s$ for memory cell selection and a capacitor element C for information storage, for which the SPC structure is adopted. This capacitor element C for information storage, for which the SPC structure is adopted, is formed in a small hole 16 by burying successively the lower electrode 18, the ferroelectric material layer 4 and the upper electrode 19. The small hole 16 stated above 16 is formed from a principal surface of a $p^-$ type semiconductor substrate 1 in the depth direction thereof. The lower electrode 18 is disposed along the inner surface of the small hole 16 on the principal surface of the $p^-$ type semiconductor substrate through an insulating layer 17. The lower electrode 18 is connected electrically with a buried $n^+$ type semiconductor region 20 at the bottom portion of the small hole 16. This buried $n^+$ type semiconductor region 20 is used in common for all the memory cells and in this way it supplies the common plate potential thereto. The ferroelectric material layer 4 is disposed on the lower electrode 18 along it. The upper electrode 19 is disposed further on the ferroelectric material layer 4 along it. This upper electrode 19 is connected with the other $n^+$ semiconductor region 9' of the MISFET $Q_s$ for the memory cell selection.

The memory device, for which the STC structure thus constructed is adopted, can take effects substantially identical to those obtained in EMBODIMENT I, II or III.

EMBODIMENT V

In the present EMBODIMENT V, the present invention is applied to a non-volatile memory device.

Figure 11:
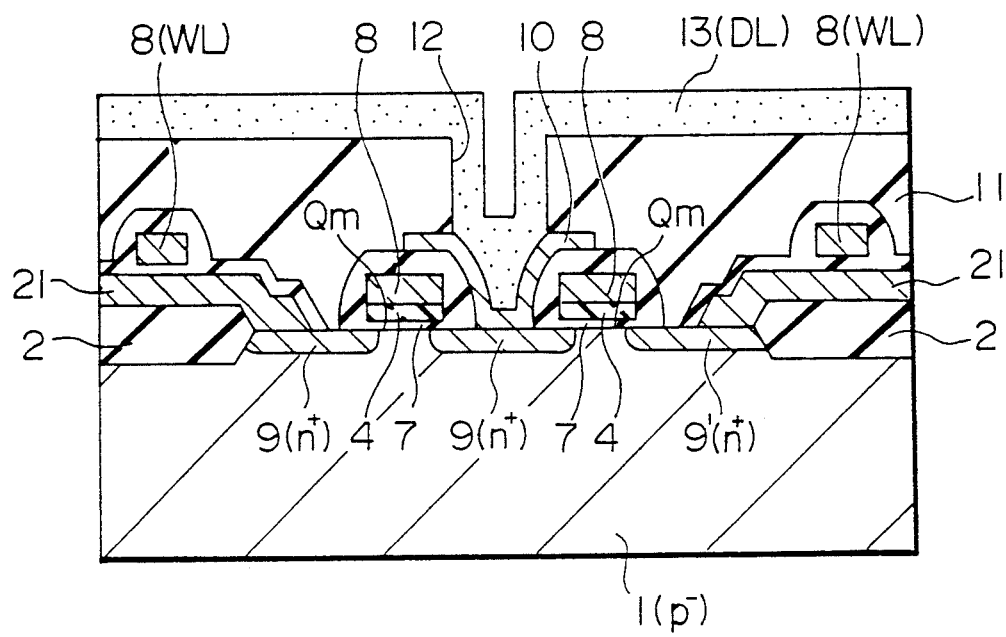
FIG. 11 is a cross sectional view of the principal part of a memory cell in the non-volatile memory device, which is EMBODIMENT V of the present invention.
Figure 12:
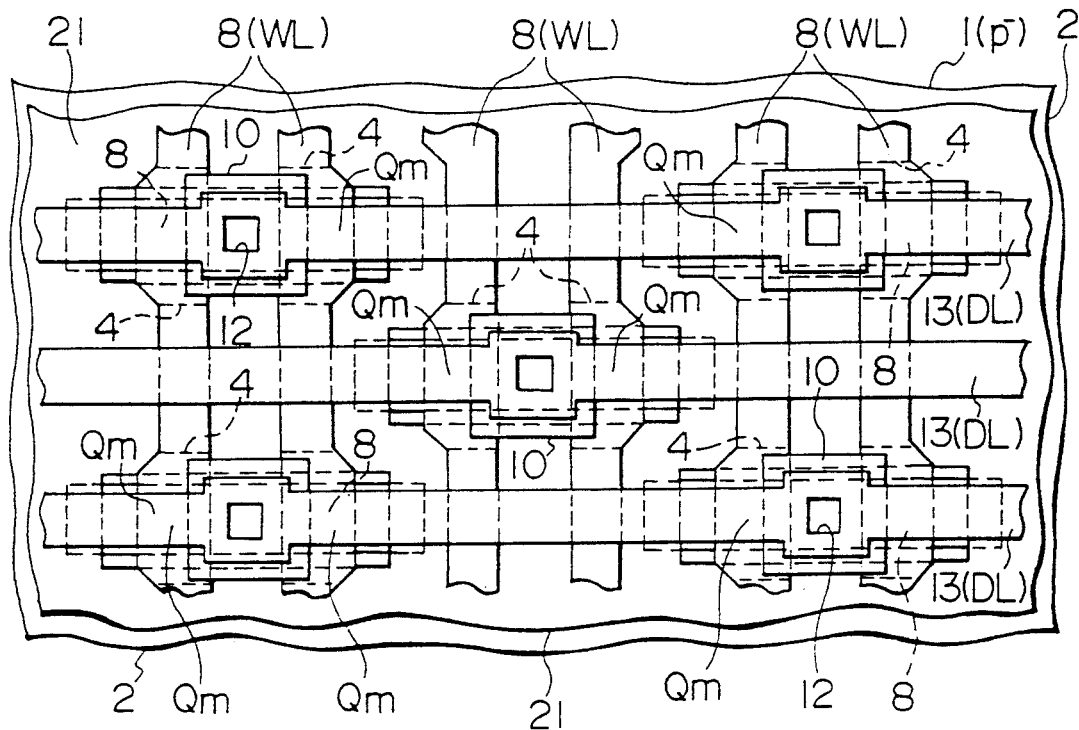
FIG. 12 is a plan view of the principal part of the memory cell indicated in FIG. 11.

The construction of a memory cell in EMBODIMENT V of the present invention is indicated in FIG. 11 (cross sectional view of the principal part) and FIG. 12 (plan view of the principal part).

As indicated in FIGS. 11 and 12, the memory cell of the non-volatile memory device in the present EMBODIMENT V is composed principally by a field effect transistor $Q_m$. This field effect transistor $Q_m$ includes a $p^-$ type semiconductor substrate (or a well region) 1, gate insulating layer 7, a gate electrode (word line WL) 8, a ferroelectric material layer 4 and a pair of n' type semiconductor regions 9 and 9' serving as the drain region and the source region, respectively. The ferroelectric material layer 4 stated above is disposed between the gate insulating layer 7 and the gate electrode 8. The $n^+$ type semiconductor region 9, which is the drain region of the field effect transistor $Q_m$ is connected with the data line (DL) 13 through an intermediate layer 10. The $n^+$ type semiconductor region 9', which is the source region, is connected with a common source electrode 21 (which is in common use to the cells and to which e.g. the ground potential is applied). That is, this field effect transistor $Q_m$ constituting the memory cell has a cross sectional structure similar to that of a memory cell EPROM or EEPROM.

Figure 18:
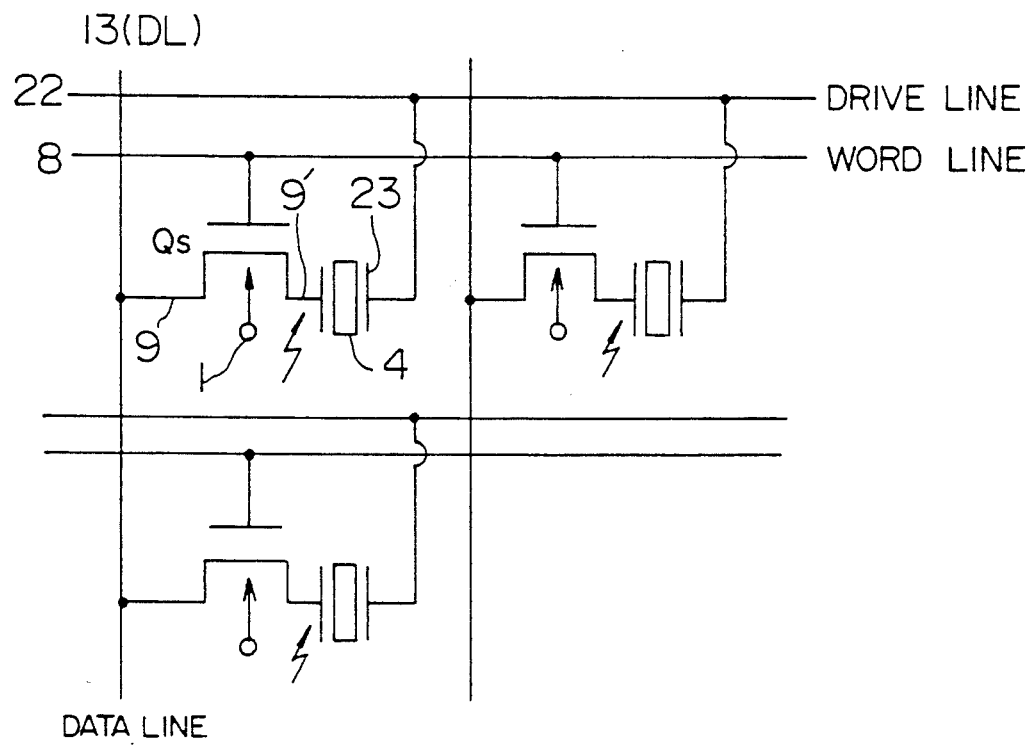
FIG. 18 is an equivalent diagram of the memory cell array shown in FIGS. 14 and 15.

In the ferroelectric material layer 4 described above, the polarization direction is varied, tracing a hysteresis loop, as explained in EMBODIMENTS I to IV described previously, by a voltage applied between the gate electrode 8 and the $p^-$ type semiconductor substrate 1 and by light or optical signals projected from the exterior (e.g., optical inputs such as of ultraviolet rays, laser radiation or X rays in the form of beam spots). This ferroelectric material layer 4 can vary the threshold voltage of the field effect transistor $Q_m$ by changing the polarization direction described above to thereby effect information writing. An equivalent circuit diagram to the memory cell array of FIGS. 11 and 12 is shown in FIG. 18.

Next, various operations of the non-volatile memory device described above will be briefly explained, referring to FIGS. 11 and 12 and TABLEs 2A to 2D at the end of the present specification. In TABLEs 2A to 2D, the column indicated by "substrate" represents the voltage applied to the $p^-$ type semiconductor substrate 1; CS the voltage applied to the common source electrode 21; WL1 the voltage applied to the selected word line 8; DL1 the voltage applied to the selected data line 13; WL2 the voltage applied to the unselected word line; and DL2 the voltage applied to the unselected data line 13.

Preparation Operation

As indicated in TABLE 2A, the preparation operation is effected by applying at first a saturation voltage $V_0$, e.g. 5 V, which is higher than the polarization reversal voltage $V_1$, to the $p^-$ type semiconductor substrate 1, the common source electrode 21 and all the data lines 13 (DL1, DL2) (regardless of whether they are in the selected state or in the unselected state) and e.g., 0 V to all the word lines 8 (WL1, WL2) (regardless of whether they are in the selected state or in the unselected state). In this way a high voltage corresponding to the saturation voltage $V_0$ is applied between the gate electrode 8 and the $p^-$ type semiconductor substrate 1 of the field effect transistor $Q_m$ in all the memory cells so that the polarization direction of the ferroelectric material layer is aligned in one direction.

Information Writing Operation

As indicated in TABLE 2B, the information writing operation is effected by applying e.g. 0 V to the $p^-$ type semiconductor substrate 1, the common source electrode 21 and all the data lines 13 and a voltage lower than the polarization reversal voltage $V_1$, the highest voltage, by which the polarization direction of the ferroelectric material layer 4 is not changed, e.g., a voltage equal to one half of the saturation voltage $V_0$, to all the data lines 8. In this state, the ferroelectric material layer 4 of the field effect transistor $Q_m$ in the memory cell corresponding to a specified bit is irradiated with light information and only in the ferroelectric material layer 4, to which this light information is projected, the polarization direction is reversed. That is, the polarization direction of the ferroelectric material layer 4 can be reversed by light energy. The light information is formed e.g. by ultraviolet ray or laser light. It is preferable that the gate electrode 8 is transparent.

Information Holding Operation

As indicated in TABLE 2C, the information holding operation is effected by applying e.g., 0 V to the $p^-$ type semiconductor substrate 1, the common source electrode 21, all the data lines 13 and all the word lines 8. Since only a voltage lower than the polarization reversal voltage $V_1$ is applied to the ferroelectric material layer 4, the polarization direction of this ferroelectric material layer 4 is held.

Information Reading Operation

As indicated in TABLE 2D, the information reading operation is effected by applying, e.g., 0 V to the $p^-$ type semiconductor substrate 1, the common source electrode 21, the unselected data lines 13 and the unselected word lines 8, and, e.g., 5 V to the selected data lines 13 and the selected word lines 8. The polarization direction of the ferroelectric material layer 4, in which the light information is projected, is changed so that the threshold voltage of the field effect transistor $Q_m$ is varied. Therefore this variation in the threshold voltage is detected in the form of a data line current.

As described above, the non-volatile memory device is includes memory cells, in each of which the ferroelectric material layer 4 is disposed between the gate insulating layer 7 and the gate electrode 8 of the field effect transistor $Q_m$; the saturation voltage higher than the polarization reversal voltage $V_1$ of the hysteresis loop of the ferroelectric material layer 4 is applied between the gate electrode 8 and the p$^-$ type semiconductor substrate 1 of all the memory cells in this non-volatile memory device so that the polarization direction of the ferroelectric material layer 4 is aligned in one direction; the ferroelectric material layer 4 in the predetermined memory cells among all the memory cells described above is irradiated with light so as to change this polarization direction of the ferroelectric material layer 4 to the other; and the polarization direction of the ferroelectric material layer 4 of all the memory cells described above is electrically detected. The polarization direction of the ferroelectric material layer 4 is detected by detecting variations in the threshold voltage of the field effect transistor $Q_m$. Not only can this structure can effects substantially identical to those obtained by EMBODIMENTS I to IV described previously, but also since the light information can be read out from the non-volatile memory device in the form of electric information and the light information can be held even in the state where no external voltage is applied, it is possible to realize a non-volatile memory device for light information. This non-volatile memory device can be applied to a two-dimensional optical sensor used in an optical detector for an electronic camera (e.g., an imaging element), an optical detector for length measurement, etc. and an optical sensor in a pickup device for laser disks, etc.

Further information can be held by the non-volatile memory device, even in the case where the power supply of the device is turned off. However, when the power supply of the device is turned off, in order not to destroy the information when the power supply is again turned on after the turn-off, the following sequence control should be effected.

Turn-off of Power Supply of Device

Figure 13A:
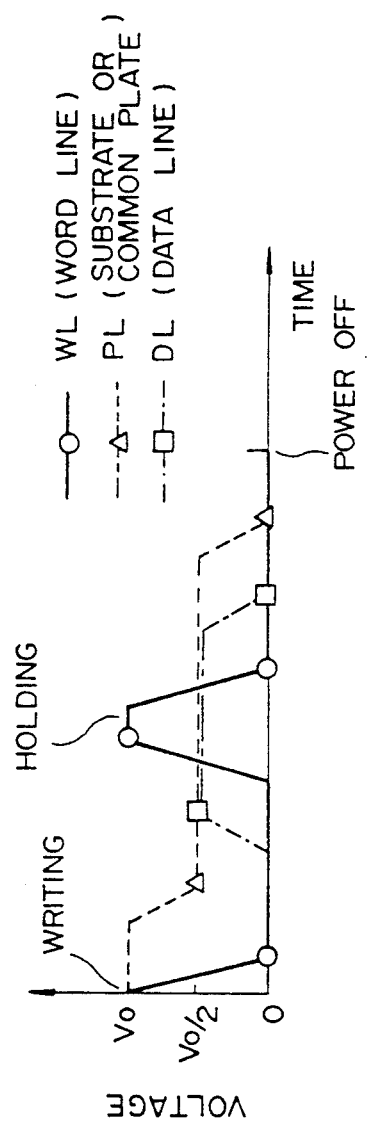
FIGS. 13A and 13B are diagrams indicating the time sequence of voltages, which are to be applied to the memory cell in the memory device at the turn-off and turn-on of the power supply, respectively.

In the case where the power supply of the device is cut off, referring to FIG. 13A, at first 0 V is applied to all the word lines (WL); the voltage lower than the polarization reversal voltage $V_1$, e.g., the voltage equal to one half of the saturation voltage $V_0$ to the p$^-$ type semiconductor substrate 1 and all the data lines 13 (DL); and, e.g., 5 V is applied to all the word lines 8 so that they are in the "H" state, in order to establish the information holding state. Next 0 V is applied to the p$^-$ type semiconductor substrate 1, all the data lines 13 and all the word lines 8 and the power supply of the device is turned off. That is, a sequence control is performed, by which no voltage higher than the polarization reversal voltage $V_1$ is applied to the ferroelectric material layer 4. Namely, each cell is transferred from the state in which various voltages are applied to the cell right before the power supply to the memory device is turned off to a holding state in which the selection voltage is applied to the word lines and voltages lower than the polarization reversal voltage are applied to the ferroelectric material films 4, with the voltage applied to the ferroelectric material film 4 being kept lower than the polarization reversal voltage, and then, the voltages on the word lines, data lines and the substrate are reduced to zero, and the power supply is turned off.

Turn-on of Power Supply of Device

Figure 13B:
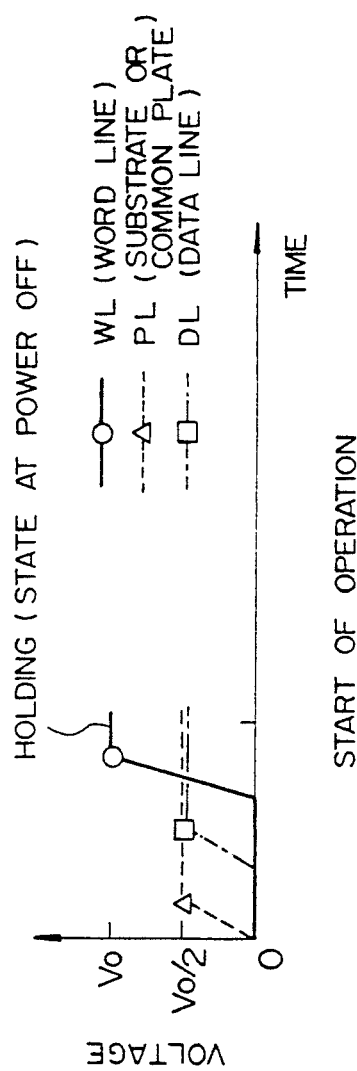

In the case where the power supply is switched on, referring to FIG. 13B, at first the p$^-$ type semiconductor substrate 1 and all the data lines 13 (DL) are raised from 0 V to the voltage equal to one half of the saturation voltage $V_0$ and all the word lines 8 (WL) are raised from 0 V to 5 V, in order to establish the information holding state. Similarly a sequence control is performed, by which no voltage higher than the polarization reversal voltage $V_1$ is applied thereto. Namely, after the power supply is turned on, each cell is transferred to the holding state, with the voltage applied to the ferroelectric material film 4 being kept lower than the polarization reversal voltage.

These sequence controls are analogous also for the memory devices described in EMBODIMENTs I to IV described previously. However the potential of the p$^-$ type semiconductor substrate 1 is substituted by the common plate potential.

EMBODIMENT VI

In the present EMBODIMENT VI, the present invention is applied to another type of the non-volatile memory device.

Figure 14:
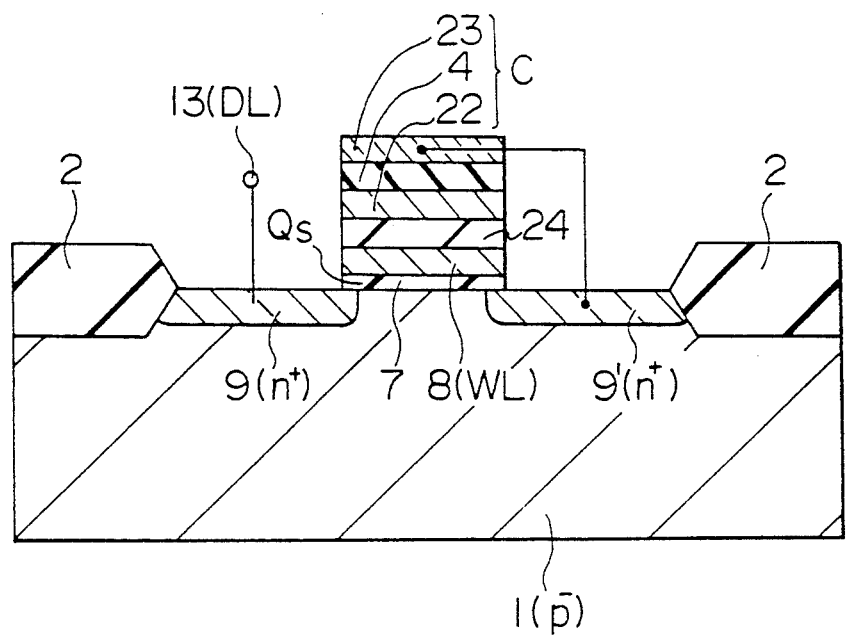
FIG. 14 is a schematic cross sectional view of the principal part of a memory cell of the non-volatile memory device, which is EMBODIMENT VI of the present invention.
Figure 15:
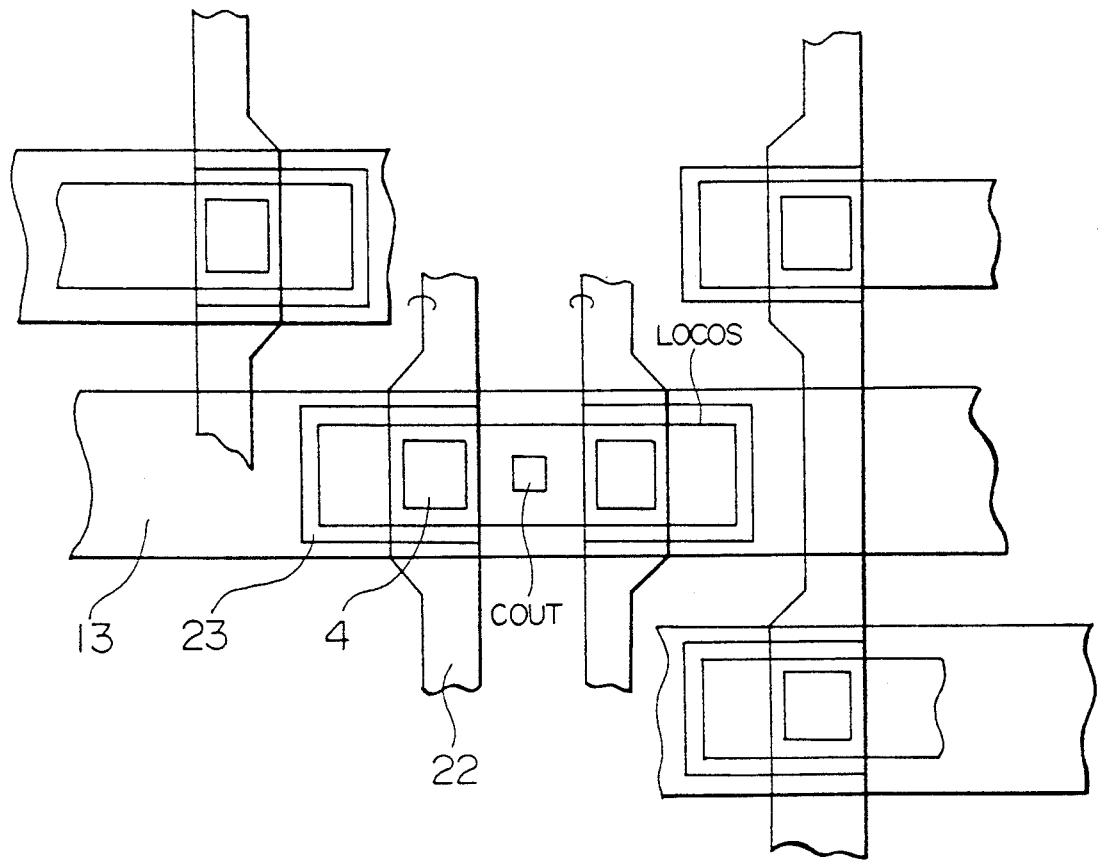
FIG. 15 is a plan view of the principal part of the memory cell indicated in FIG. 14.

The construction of a memory cell in EMBODIMENT VI of the present invention is indicated in FIG. 14 (cross sectional view of the principal part) and FIG. 15 (schematical plan view of the principal part).

The memory cell of the non-volatile memory device in the present EMBODIMENT VI includes a series circuit consisting of an MISFET $Q_s$ for memory cell selection and a capacitor element C for information storage.

The MISFET $Q_s$ for memory cell selection has a construction substantially identical to that of the MISFET $Q_s$ for memory cell selection of the memory cell in the memory device in each of EMBODIMENT I to IV described previously.

The capacitor element C for information storage is constructed by superposing successively a drive line 22, a ferroelectric material layer 4 and a transparent electrode 23 on the gate electrode 8 of the MISFET $Q_s$ for memory cell selection through an insulating layer 24. The drive line 22 extends in the same direction as the word line (WL) 8 and a predetermined voltage (e.g. 0 V to saturation voltage $V_0$) is applied thereto. The transparent electrode 23 is connected with the other n$^+$ type semiconductor region 9' of the MISFET $Q_s$ for memory cell selection. The transparent electrode 23 may be made of e.g. a Nesa film (a tin oxide film). In the capacitor element C for information storage, similarly to the non-volatile memory device described in EMBODIMENT V, the polarization direction is aligned previously in one direction and thereafter the information writing is effected by inverting the polarization direction by projecting light information signal to the ferroelectric material layer 4 corresponding to a predetermined bit. That is, the non-volatile memory device in the present EMBODIMENT VI is constructed by combining the memory device explained in EMBODIMENTs I to IV with the non-volatile memory device explained in EMBODIMENT V. An equivalent circuit diagram to the memory array of FIGS. 14 and 15 is shown in FIG. 10.

Since the operation of the non-volatile memory device in EMBODIMENT VI is somewhat similar to that of the device referred to in EMBODIMENT V, that will be briefly explained with reference to TABLES 3A to 3D similar to TABLES 2A to 2D.

TABLE 3A is concerned with the preparation operation in which the ferroelectric material films in substantially all of the memory cells are polarized in one and the same direction. TABLE 3B is concerned with the information writing operation in which a voltage of $V_0/2$ is applied to the ferroelectric material films in substantially all of the memory cells so that those of the cells which receive optical inputs have their ferroelectric material films reverse their polarization directions. TABLE 3C is concerned with the information holding operation in which a voltage of $V_0/2$ is applied to the data lines and to the drive lines in substantially all of the memory cells so that the ferroelectric material films are supplied with 0 V and the word lines are supplied with "H" (high) potentials. TABLE 3D is concerned with the information reading operation in which the description on TABLE 1C is applicable to TABLE 3D by regarding the plate voltage as the drive line voltage.

Further the memory cell in the non-volatile memory device in the present EMBODIMENT VI may include of a conductive layer (corresponding to the transparent electrode 23) connected with the other n+ type semiconductor region 9' of the MISFET $Q_s$ for memory cell selection, the ferroelectric material layer 4 and the drive line 22 superposed successively on each other.

As described above, the non-volatile memory device includes a plurality of memory cells arranged in a predetermined manner, each of which includes a series circuit consisting of an MISFET $Q_s$ for memory cell selection and a capacitor element C for information storage, in which a ferroelectric material layer 4 is disposed between the electrodes (drive line 22 and transparent electrode 23) and the polarization direction of the ferroelectric material layer 4 is aligned in one direction by the saturation voltage $V_0$ higher than the polarization reversal voltage $V_1$ of the hysteresis loop of the ferroelectric material layer 4 between the electrodes of the capacitor element C for information storage in all the memory cells of the non-volatile memory device; the polarization direction of the ferroelectric material layer 4 is changed into the other by irradiating the ferroelectric material layer 4 of the capacitor element C for information storage in predetermined memory cells among all the memory cells with light; and the polarization direction of the ferroelectric material layer 4 of the capacitor element C for information storage in all the memory cells is detected electrically. This construction can takes effects substantially analogous to those obtained in EMBODIMENT V described previously.

Figure 16A:
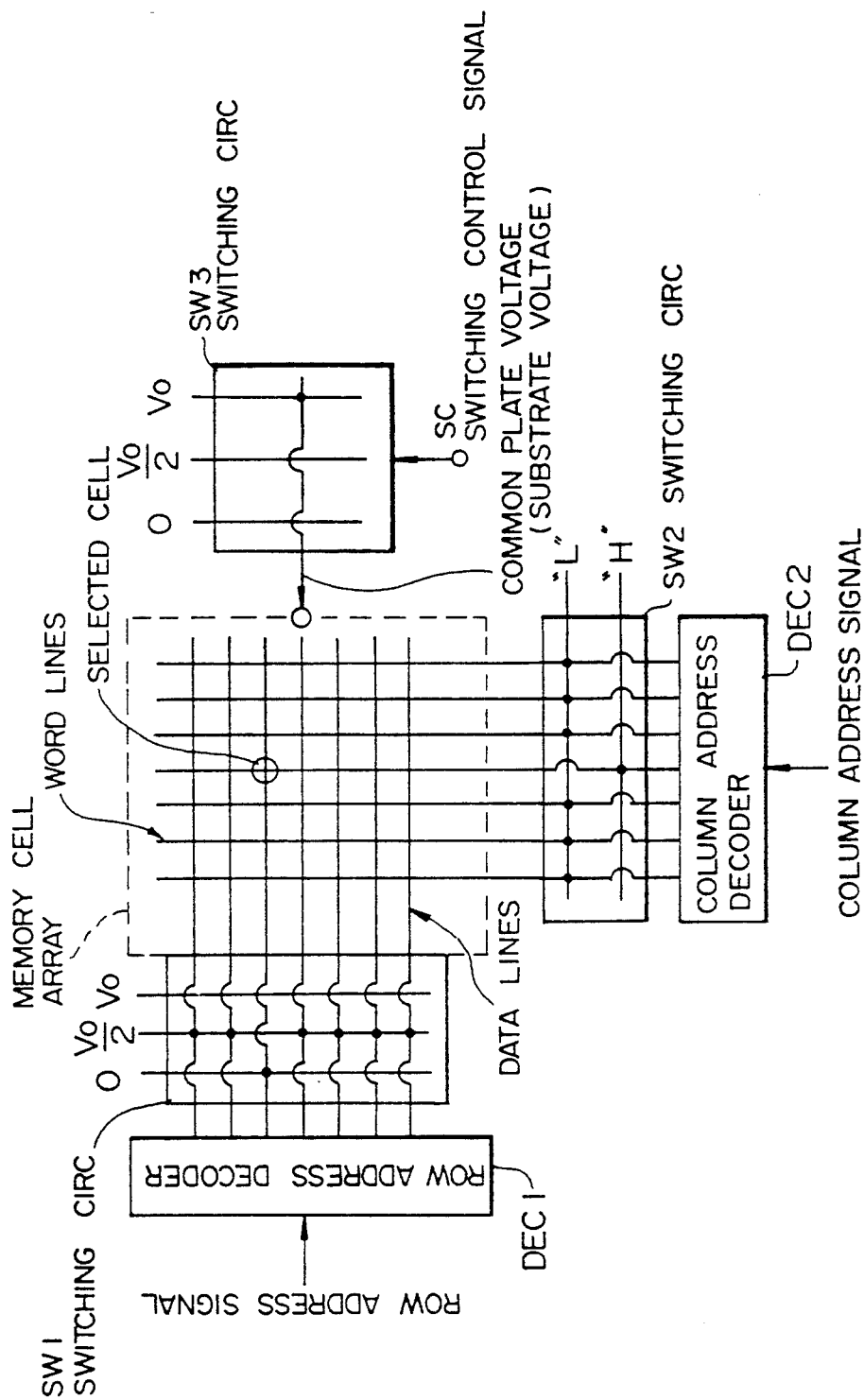
FIGS. 16A to 16C are diagrams showing examples of means for applying predetermined voltages to the memory cell array.

FIG. 16A schematically shows an example of arrangement of a memory cell, a row address decoder, a column address decoder and means for supplying various voltages to each memory cell for the above-described information writing/reading operations and for the above-described power supply on/off sequences of the memory device. Since the applied voltages in the above-described writing, reading and holding operations and the power supply on/off sequences are 0 V, $V_0/2$ V or $V_0$ V to the data lines and to the common plate (or substrate) and "H" level voltage (e.g., 5 V) and "L" level voltage (e.g., 0 V) to the word lines, it will be possible to supply these voltages from a voltage source of a known structure (not shown).

As shown in FIG. 16A, voltage supply lines for 0 V, $V_0/2$ V or $V_0$ V are coupled to first and third switching circuits SW1 and SW3, while "H" level voltage and "L" level voltage to the word lines, which may be generated by the above-mentioned voltage source, are also coupled to a second switching circuit SW2. The first switching circuit SW1 is arranged between the row address decoder DEC1 and the memory cell array so as to select, for each of the data lines, one of the three voltage values depending on the output of the decoder DEC1 and to apply the selected voltages to the respective data lines. The second switching circuit SW2 is arranged between the column address decoder DEC2 and the memory cell array so as to select, for each of the word lines, one of the two voltage values depending on the output of the decoder DEC2 and to apply the selected voltages to the respective word lines. The third switching circuit SW3 serves to select one of the three voltage values in response to a predetermined control signal $S_c$ and to apply the selected voltage to the common plate or the substrate of the memory cell array as described above in connection with the various embodiments.

For the power supply on/off sequences for the memory device, address signals and switching control signal such as for achieving the sequences illustrated in FIGS. 13A and 13B, which are different from those for the information writing/reading operations, are applied to the decoders DEC1 and DEC2 and the third switching circuit SW3.

Figure 16B:
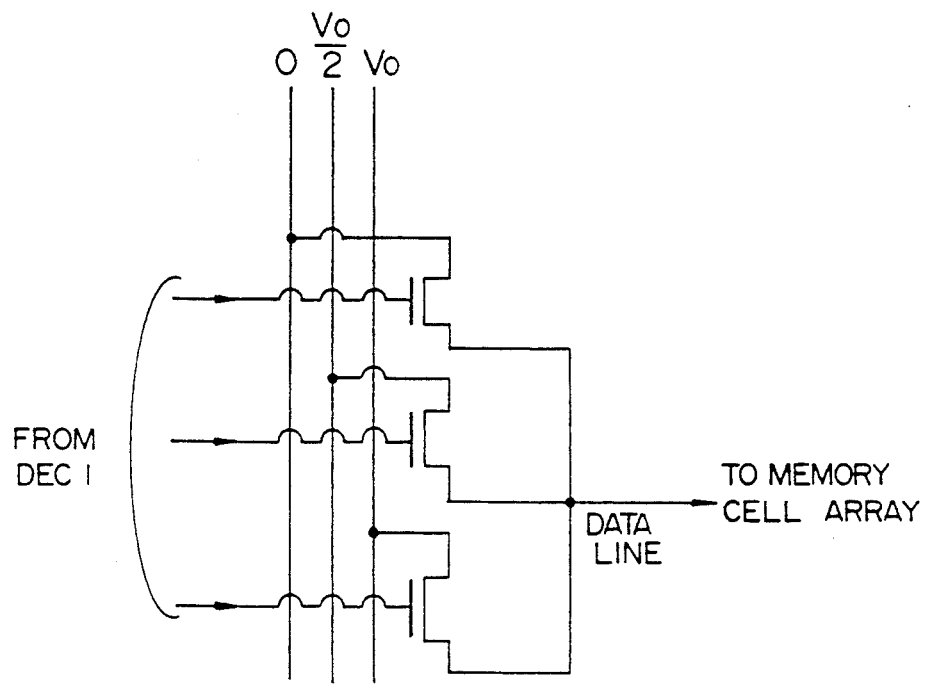
Figure 16C:
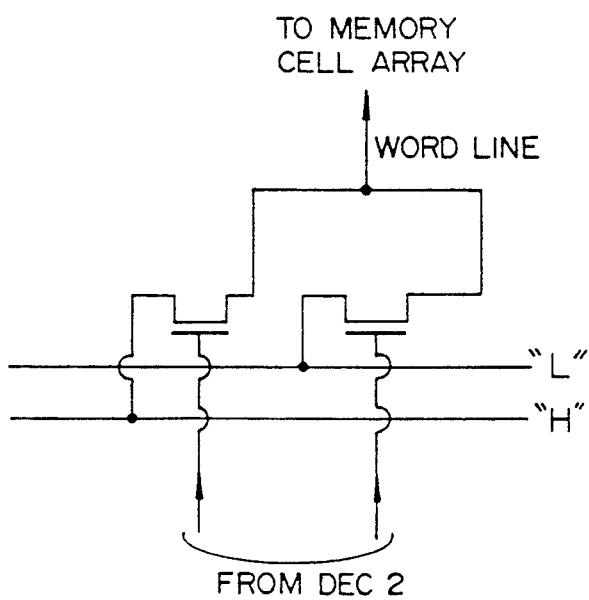
Figure 17:
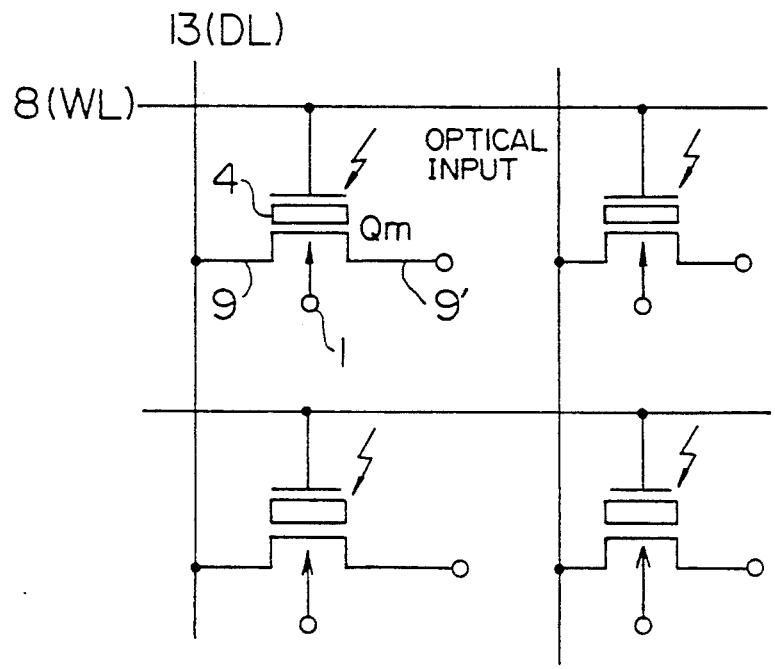
FIG. 17 is an equivalent circuit diagram of the memory cell array shown in FIGS. 11 and 12.

FIGS. 16B and 16C show examples of the principal parts of the first and second switching circuits SW1 and SW2. It is clear that the third switching circuit will be implemented with a structure similar to that shown in FIG. 16B.

In the above, the invention made by the present inventors has been specifically explained on the basis of the embodiments described above. However, the present invention is not restricted to the embodiments, but it is a matter of course that various modifications are possible without departing from the spirit of the invention.

For example, the present invention can be applied to a memory device or a non-volatile memory device mounted on a one-chip microcomputer.

TABLE 1A

|   | PL | DL1 | WL1 | DL2 | WL2 |
|---|----|-----|-----|-----|-----|
| a | $V_0$ | 0<br>← (polarization) | H | $V_0/2$ | O |
| b | 0 | $V_0$<br>→ (polarization) | H | $V_0/2$ | 0 |

TABLE 1B

|   | PL | DL1 | WL1 | DL2 | WL2 |
|---|----|-----|-----|-----|-----|
| a | $V_0/2$ | $V_0/2$ ← | H | $V_0/2$ | H |
| b | $V_0/2$ | $V_0/2$ → | H | $V_0/2$ | H |

TABLE 1C

|   | PL | DL1 | WL1 | DL2 | WL2 | Information at DL1 |
|---|----|-----|-----|-----|-----|--------------------|
| a | $V_0/2 \to V_0$ | O | H | $V_0/2$ | O | ← held |

TABLE 1C-continued

| | PL | DL1 | WL1 | DL2 | WL2 | Information at DL1 |
|---|---|---|---|---|---|---|
| b | $V_0/2 \rightarrow V_0$ ← → | O | H | $V_0/2$ | H | ← inverted |

TABLE 2A

| Substrate | WL1 | DL1 | WL2 | DL2 | CS |
|---|---|---|---|---|---|
| ↑ $V_0$ | O | $V_0$ | O | $V_0$ | $V_0$ |

TABLE 2B

| Substrate | WL1 | DL1 | WL2 | DL2 | CS | Optical information |
|---|---|---|---|---|---|---|
| ↓ | O | $V_0/2$ | O | $V_0/2$ | O | O Received |
| ↑ | O | $V_0/2$ | O | $V_0/2$ | O | O Not received |

TABLE 2A

| Substrate | WL1 | DL1 | WL2 | DL2 | CS |
|---|---|---|---|---|---|
| ↓ | O | O | O | O | O | O |
| ↑ | O | O | O | O | O | O |

TABLE 2D

| Substrate | WL1 | DL1 | WL2 | DL2 | CS | Change in Vth |
|---|---|---|---|---|---|---|
| ↓ | O | H | H | O | O | O | Vth − ΔV |
| ↑ | O | H | H | O | O | O | Vth − ΔV |

TABLE 3A

| Selected cell | | | | Unselected Cell | | | |
|---|---|---|---|---|---|---|---|
| Polarization | WL1 | DL1 | DR1 | Polarization | WL2 | DL2 | DR2 |
| ↑ | H | O | $V_0$ | ↑ | H | O | $V_0$ |

TABLE 3B

| Selected cell | | | | Unselected cell | | | |
|---|---|---|---|---|---|---|---|
| Polarization | WL1 | DL1 | DR1 | Optical input | WL2 | DL2 | DR2 |
| ↓ | H | $V_0$ | $V_0/2$ | Received | H | $V_0/2$ | $V_0/2$ |
| ↑ | H | $V_0$ | $V_0/2$ | Not Received | H | $V_0/2$ | $V_0/2$ |

TABLE 3C

| Selected cell | | | | Unselected cell | | | |
|---|---|---|---|---|---|---|---|
| Polarization | WL1 | DL1 | DR1 | WL2 | DL2 | DR2 |
| ↑ ↓ | H | $V_0/2$ | $V_0/2$ | H | $V_0/2$ | $V_0/2$ |

TABLE 3D

| Selected cell | | | | Unselected cell | | | |
|---|---|---|---|---|---|---|---|
| Polarization | WL1 | DL1 | DR1 | WL2 | DL2 | DR2 |
| ↓ held | H | $O \rightarrow V_0$ | O | O | O | $V_0/2$ |
| ↑ → ↓ | H | $O \rightarrow V_0$ | O | O | O | $V_0/2$ |

We claim:

1. A photosensitive non-volatile semiconductor IC device comprising:
   a memory cell array formed in a substrate, in which a plurality of non-volatile memory cells are arranged in a predetermined manner, each of which includes a series circuit comprised of a MISFET for memory cell selection and an information storage capacitor element having a first electrode connected with one semiconductor region of said MISFET, a second electrode disposed, opposite to said first electrode, and a ferroelectric material layer disposed between said first and said second electrodes, the polarization direction of which ferroelectric material varies, tracing a hysteresis loop, depending on a voltage applied between the first and second electrodes and light emitted to said ferroelectric material layer;
   means for polarizing said ferroelectric material layers of the capacitor elements of said plurality of memory cells in said memory cell array in a first direction by applying a preparation voltage higher than a polarization reversal voltage in the hysteresis loop of said ferroelectric material layer between said first and said second electrodes of said capacitor elements;
   means for activating ferroelectric material layers of predetermined memory cells in said memory array toward a second direction opposite to said first direction in the hysteresis loop by applying a write voltage between said first and second electrodes of the capacitor elements of said predetermined memory cells, said write voltage having an amplitude smaller than that of the polarization reversal voltage which would be necessary to invert the polarization direction to said second direction;
   means for inverting the polarization direction of the ferroelectric material layers of said predetermined memory cells in said memory cell array to said second direction by irradiating said ferroelectric material layers of said predetermined memory cells with light to exceed the polarization reversal voltage.

2. A photosensitive non-volatile semiconductor memory device according to claim 1, in which one of said first and second electrodes of the capacitor element of each of said memory cells is transparent.

3. A photosensitive non-volatile semiconductor memory device comprising:
   a semiconductor substrate;
   a non-volatile memory cell array including a plurality of photosensitive memory cells arranged in rows and columns, each of said memory cells having a switching transistor element and a capacitor element connected in series with said transistor element, said switching transistor element having a control electrode layer and first and second main electrode regions formed in said substrate between which electric current is allowed to flow when said switching transistor element is conductive, said gate electrode layer being formed over said semiconductor substrate between said first and second main electrode regions, said capacitor element having first and second electrode layers and a ferroelectric material layer sandwiched therebetween, said capacitor element being formed over said control electrode layer of said transistor element and insulated therefrom and having its first electrode electrically connected with said second main electrode region of said transistor element, said ferroelectric material layer exhibiting a polarization varied in response to a voltage applied across said first and second electrode of said capacitor element and light emitted to said ferroelectric material layer in which a direction of polarization is reversed when a sum of energy of said emitted light and said applied voltage is varied to reach a polarization reversal level of energy;

a plurality of first conductors each connected in common with first main electrode regions of transistor elements of those memory cells which are on one column of the memory cell array;

a plurality of second conductors each connected in common with control electrode layers of transistor elements of those memory cells which are on one row of the memory cell array;

a plurality of third conductors each connected in common with second electrode layers of capacitor elements of those memory cells which are on one row of the memory cell array;

means for generating first selection voltage signals to be applied to said first conductors and means for generating second selection voltage signals to be applied to said second conductors; and means for generating control voltage signals to be applied to said third conductors, said first selection voltage signals and control voltage signals, when information is written in said memory device, having values such that said ferroelectric material layers of said memory cells are not subjected to a voltage which by itself causes reversal of polarization without any optical input to said memory cells.

4. A photosensitive non-volatile semiconductor memory device according to claim 3, in which one of said first and second electrode layers of the capacitor element of each of said memory cells is transparent.

5. A photosensitive non-volatile semiconductor IC device comprising:

a memory cell array formed in a substrate, in which a plurality of non-volatile memory cells are arranged in a predetermined manner, in each of which a ferroelectric material layer is disposed between a gate insulating layer and a gate electrode layer of a field effect transistor, the polarization direction of which ferroelectric material varies, tracing a hysteresis loop, depending on a voltage applied thereto and light emitted thereonto;

means for polarizing the ferroelectric material layers in said plurality of memory cells in said memory cell array in a first direction by applying a preparation voltage higher than a polarization reversal voltage in the hysteresis loop of said ferroelectric material layer between said gate electrode layers and the substrate;

means for activating the ferroelectric material layer of each of said memory cells toward a second direction opposite to said first direction in the hysteresis loop by applying a write voltage between said gate electrode layer and said substrate, said write voltage having an amplitude smaller than that of the polarization reversal voltage which would be necessary to invert the polarization material to the second direction; and means for inverting the polarization direction of the ferroelectric layers of predetermined memory cells in said memory cell array to said second direction by irradiating said ferroelectric material layers of said predetermined memory cells to exceed the polarization reversal voltage with light.

6. A photosensitive non-volatile semiconductor memory device according to claim 5, in which gate electrode layer of each of said field effect transistors is transparent.

7. A photosensitive non-volatile semiconductor memory device comprising:

a semiconductor substrate;

a non-volatile memory cell array including a plurality of photosensitive memory cells arranged in rows and columns, each of said memory cells having a transistor structure element having a control electrode layer, a ferroelectric material layer underlying said control electrode layer and first and second main electrode regions formed in said substrate between which electric current is allowed to flow when said transistor structure element is conductive, said gate electrode layer and said ferroelectric material layer being formed over and electrically insulated from said semiconductor substrate between said first and second main electrode regions, said ferroelectric material layer exhibiting a polarization varied in response to a voltage applied thereto and light emitted thereonto in which a direction of polarization is reversed when a sum of energy of said emitted light and said applied voltage is varied to reach a polarization reversal level of energy;

a plurality of first conductors each connected in common with first main electrode regions of transistor structure elements of those memory cells which are on one column of the memory cell array;

a plurality of second conductors each connected in common with control electrode layers of transistor structure elements of those memory cells which are on one of the memory cell array;

a common electrode layer connected in common with the second main electrode region of the transistor structure element of each of said memory cells;

means for generating first selection voltage signals to be applied to said first conductors and means for generating second selection voltage signals to be applied to said second conductors; and means for generating control voltage signals to be applied to said common electrode layer, said second selection voltage signals and control voltage signals, when information is written in said memory device, having values such that said ferroelectric material layers of said memory cells are not subjected to a voltage which by itself causes reversal of polarization without any optical input to said memory cells.

8. A photosensitive non-volatile semiconductor memory device according to claim 7, in which said control electrode layer of each of said transistor structure elements is transparent.

* * * * *